US008421498B2

(12) United States Patent
Ichikawa (10) Patent No.: US 8,421,498 B2
(45) Date of Patent: Apr. 16, 2013

(54) SEMICONDUCTOR DEVICE WITH BUS CONNECTION CIRCUIT AND METHOD OF MAKING BUS CONNECTION (75) Inventor: Takeshi Ichikawa, Tokyo (JP)

(73) Assignee: Lapis Semiconductor Co., Ltd. (JP)

( * ) Notice: Subject to any disclaimer, the term of this patent is extended or adjusted under 35 U.S.C. 154(b) by 5 days.

(21) Appl. No.: 13/157,852

(22) Filed: Jun. 10, 2011

(65) Prior Publication Data
US 2011/0316581 A1 Dec. 29, 2011

(30) Foreign Application Priority Data

Jun. 24, 2010 (JP) ................................. 2010-143864

(51) Int. Cl.
H03K 19/003 (2006.01)
H03K 17/16 (2006.01)
(52) U.S. Cl.
USPC ........................................................... 326/30
(58) Field of Classification Search ................... None
See application file for complete search history.

(56) References Cited

U.S. PATENT DOCUMENTS 7,420,386 B2 * 9/2008 Wang et al. ..................... 326/30
7,423,450 B2 * 9/2008 Santurkar et al. .............. 326/30

FOREIGN PATENT DOCUMENTS

JP 2138612 A 5/1990

* cited by examiner

Primary Examiner — Crystal L Hammond
(74) Attorney, Agent, or Firm — Rabin & Berdo, P.C.

(57) ABSTRACT

A semiconductor device capable of achieving desirable communication behavior through a bus regardless of whether or not a pull-up resistor is connected on a bus line. The semiconductor device includes external pull-up determination unit and internal pull-up setting unit. The external pull-up determination unit applies a pull-down voltage through an internal pull-down resistor to the bus line, and determines whether an external pull-up resistor external to the semiconductor device is connected on the bus line on the basis of the voltage level of the bus line when the pull-down voltage is applied to the bus line. The internal pull-up setting unit stops application of the pull-down voltage, and applies a pull-up voltage through an internal pull-up resistor to the bus line if it is determined that no external pull-up resistor is connected on the bus line. The internal pull-up setting unit stops application of the pull-down voltage if it is determined that the external pull-up resistor is connected on the bus line.

17 Claims, 9 Drawing Sheets

| INPUT | | OUTPUT | |
|---|---|---|---|
| OE | CLOCK SIGNAL OR DATA SIGNAL | A | Y |
| 1 | 0 OR 1 | X | Hiz |
| 0 | 0 | 0 | 0 |
| 0 | 1 | 1 | 1 |

| INPUT | | | | OUTPUT | |
|---|---|---|---|---|---|
| OE | CLOCK SIGNAL OR DATA SIGNAL | CNTU | CNTD | A | Y |
| 1 | 0 OR 1 | 0 | 0 | X | Hiz |
| 1 | 0 OR 1 | 0 | 1 | 0 | 0 |
| 1 | 0 OR 1 | 1 | 0 | 1 | 1 |
| 0 | 0 | X | X | 0 | 0 |
| 0 | 1 | X | X | 1 | 1 |
| X | 0 OR 1 | 1 | 1 | X | X |

SEMICONDUCTOR DEVICE WITH BUS CONNECTION CIRCUIT AND METHOD OF MAKING BUS CONNECTION

BACKGROUND OF THE INVENTION

1. Field of the Invention

The present invention relates to a semiconductor device with a bus connection circuit adapted to make communication with an external device, and a method of making bus connection to the external device from the semiconductor device.

2. Background Art

Figure 1:
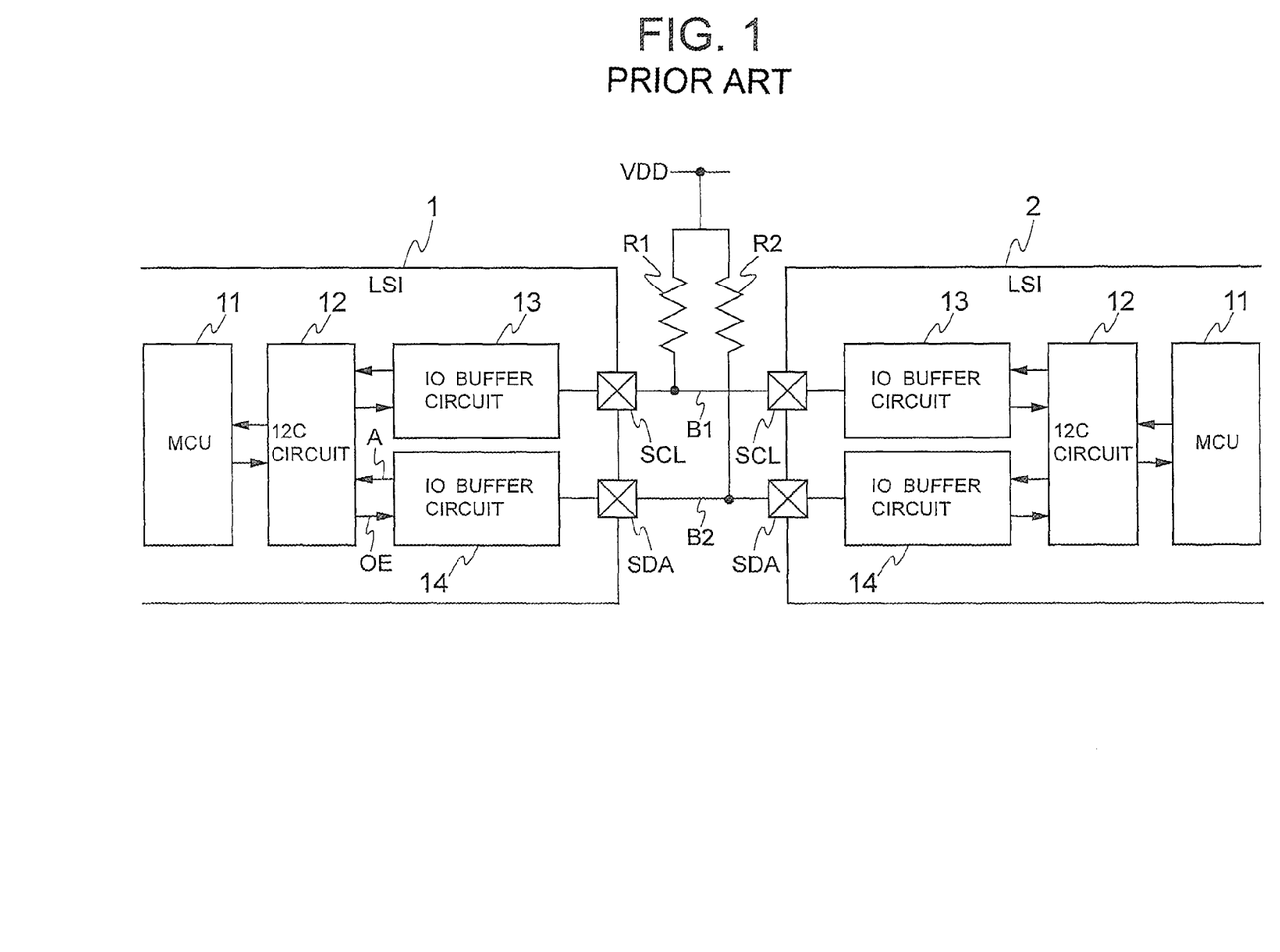
FIG. 1 is a block diagram of two conventional LSIs having bus connection circuits.

FIG. 1 of the accompanying drawings shows a circuit configuration of two conventional semiconductor devices (LSIs: large-scale integrations) 1 and 2 with the same bus connection circuit. The bus connection circuit is compatible with what is called an I²C bus. Each of the LSIs 1 and 2 includes an MCU (micro control unit) 11, an I2C circuit 12, and two IO buffer circuits 13 and 14 that form in combination the bus connection circuit. Each of the LSIs 1 and 2 also includes two connecting terminals, namely a serial clock terminal SCL and a serial data terminal SDA. The MCU 11 is an arithmetic processor for controlling the entire LSI, and operates according to a program stored in an internal ROM (not shown) and/or RAM (not shown). The I2C circuit 12 is a logic circuit, and it is controlled by the MCU 11 to control an I²C bus function. More specifically, the I2C circuit 12 supplies output enable signals OE separately to the IC buffer circuits 13 and 14, and receives input signals A separately from the IO buffer circuits 13 and 14. Each of the IO buffer circuits 13 and 14 is an input and output buffer having an open drain function. The IO buffer circuit 13 is provided for input and output of a clock signal, and is connected to the serial clock terminal SCL. The IO buffer circuit 14 is designed for input and output of a data signal, and is connected to the serial data terminal SDA.

The respective serial clock terminals SCL of the LSIs 1 and 2 are connected to each other through a bus line B1. The respective serial data terminals SDA of the LSIs 1 and 2 are connected to each other through another bus line B2. A voltage VDD is applied through a pull-up resistor R1 to the bus line B1. The voltage VDD is also applied through another pull-up resistor R2 to the bus line B2.

Figure 2:
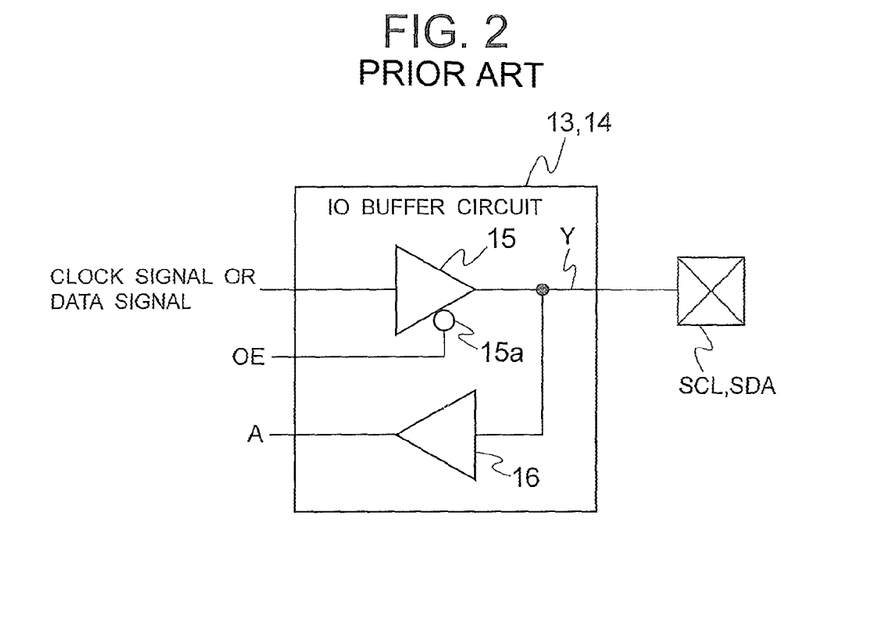
FIG. 2 is a circuit diagram showing the internal structure of an IO buffer circuit in the LSI shown in FIG. 1.

As shown in FIG. 2 of the accompanying drawings, each of the IO buffer circuits 13 and 14 has an output buffer 15 with an enable terminal, and an input buffer 16. The output buffer 15 operates in response to an output enable signal OE supplied to an enable terminal 15a. The output buffer 15 of the IO buffer circuit 13 supplies a clock signal to the serial clock terminal SCL when the output enable signal OE is at a low level representing a logic 0. The output buffer 15 of the IO buffer circuit 14 supplies a data signal to the serial data terminal SDA when the output enable signal OE is at a low level representing a logic 0. The output buffer 15 is at high impedance when the output enable signal OE is at a high level representing a logic 1. The input buffer 16 of the IO buffer circuit 13 supplies a signal of the serial clock terminal SCL as the input signal A to the I2C circuit 12. The input buffer 16 of the IO buffer circuit 14 supplies a signal of the serial data terminal SDA as the input signal A to the I2C circuit 12.

Figure 3:
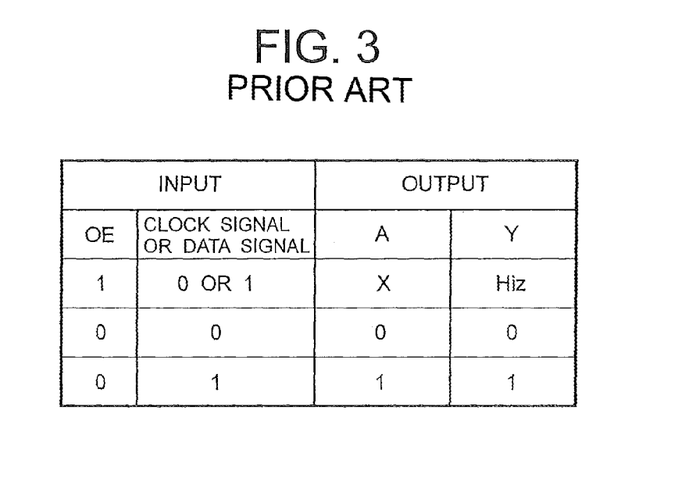
FIG. 3 shows a truth table relating to inputs and outputs of the buffer circuit shown in FIG. 2.

FIG. 3 of the accompanying drawings shows a truth table relating to input and output signals of each of the IO buffer circuits 13 and 14. In this truth table, OE represents the logic value of the output enable signal OE, A represents the logic value of the received signal A, and Y represents the logic value at the terminal SCL or SDA. Hiz represents the state of high impedance, and X represents a state when a logic value is neither 0 nor 1.

Figure 4:
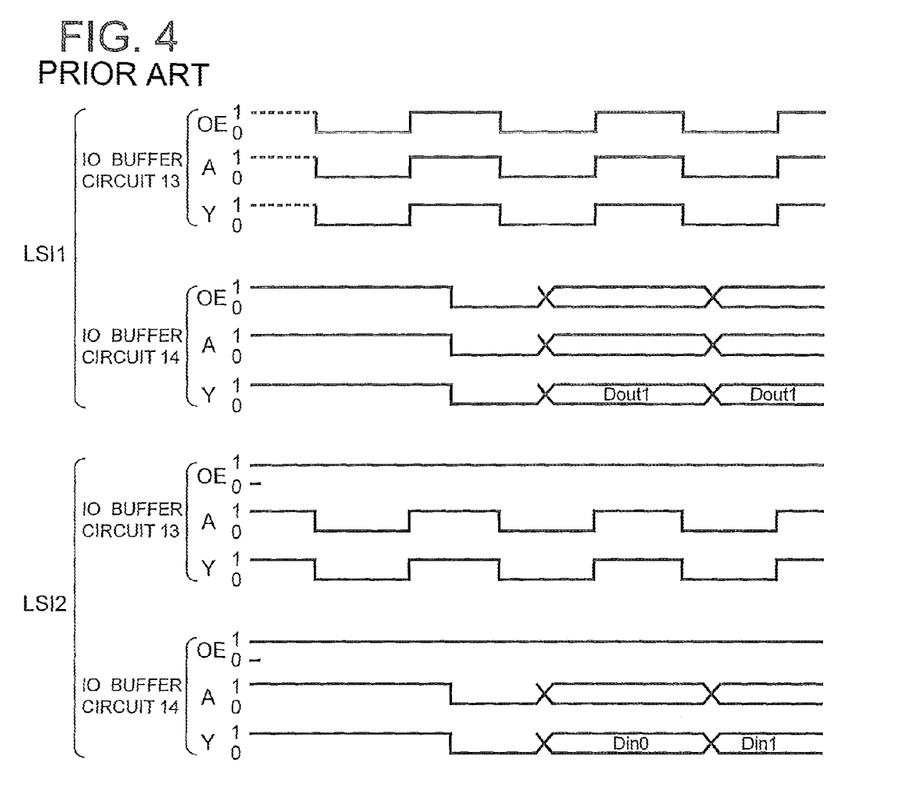
FIG. 4 is a timing chart for various signals in the buffer circuit when the right of using a bus is acquired.

FIG. 4 of the accompanying drawings shows a timing chart for the signals OE, A and Y when the right of using the I2C bus between the LSIs 1 and 2 is acquired. In the master LSI 1, the signal Y of the clock terminal SCL makes transition to a logic 0 when the output enable signal OE of the IO buffer circuit 13 becomes a logic 0. When the output enable signal OE of the IO buffer circuit 13 changes to a logic 1, the output buffer 15 is brought to a high impedance state, so that the signal Y is caused by the pull-up resistor R1 to make transition to a logic 1. When the output enable signal OE of the IO buffer circuit 14 becomes a logic 0, the signal Y of the data terminal SDA makes transition to a logic 0. Conditions for starting communications between the two devices 1 and 2 are met if the data terminal SDA becomes a logic 0 while the clock terminal SCL is at a logic 1. Thus, acquisition of the right of using the I2C bus is completed.

Data of the data terminal SDA is valid while the clock terminal SCL is at a logic 1. Data can be changed while the clock terminal SCL is at a logic 0. In FIG. 4, Dout0 and Dout1 that are parts of the signal Y of the data terminal SDA show data to be transferred from the master LSI 1 to the slave LSI 2. Din0 and Din1 that are parts of the signal Y of the data terminal SDA in the slave LSI 2 show the received data.

A plurality of LSIs may be connected to a bus line outside an LSI. Accordingly, the configuration of an LSI with the above-described conventional bus connection circuit always requires a pull-up resistor of a low resistance value so that a sufficient current can be supplied to a bus connection circuit of each of the LSIs. This results in a larger number of external parts, and an increased value of a current flowing through the pull-up resistor.

A countermeasure technique thereto is disclosed, for example, in Japanese Patent Application Publication (kokai) No. 2-138612. A pull-up resistor is incorporated into an LSI to reduce the number of external parts, and the pull-up resistor is not connected to a bus line. However, communication through a bus line is not limited to that between those LSIs which have the pull-up resistors incorporated without connecting the pull-up resistors to the bus line. If an LSI with a pull-up resistor incorporated therein is mounted on an existing system equipped with another ordinary LSI and a bus line, communication between these two LSIs through a bus line should be established by using a pull-up resistor provided on the bus line of the existing system. Accordingly, the mounted LSI only with a pull-up resistor incorporated therein cannot perform desirable communication behavior through the system bus line although the mounted LSI looks a part of the existing system.

SUMMARY OF THE INVENTION

It is an object of the present invention to provide a semiconductor device capable of achieving desirable communication behavior through a bus regardless of whether or not a pull-up resistor is connected on a bus line.

Another object of the present invention is to provide a method of establishing bus connection using a semiconductor device that has no pull-up resistor connected to a bus line.

According to one aspect of the present invention, there is provided a semiconductor device with a bus connection circuit for making communication with an external device through a bus line. The bus connection circuit includes an internal pull-up resistor and an internal pull-down resistor. The bus connection circuit also includes external pull-up determination unit for applying a pull-down voltage through the internal pull-down resistor to the bus line, and determining if an external pull-up resistor external to the semiconductor device is connected on the bus line. The determination is made on the basis of a voltage level of the bus line upon application of the pull-down voltage to the bus line. The bus connection circuit also includes internal pull-up setting unit for stopping application of the pull-down voltage, and applying a pull-up voltage through the internal pull-up resistor to the bus line if the external pull-up determination unit determines that the external pull-up resistor is not connected on the bus line. The internal pull-up setting unit stops application of the pull-down voltage if the external pull-up determination unit determines that the external pull-up resistor is connected on the bus line.

The pull-down voltage is applied through the internal pull-down resistor of the semiconductor device to the bus line. It is then determined whether an external pull-up resistor is connected on the bus line on the basis of the voltage level of the bus line upon application of the pull-down voltage to the bus line. Application of the pull-down voltage is suspended and a pull-up voltage is applied through the internal pull-up resistor of the semiconductor device to the bus line if no external pull-up resistor is connected on the bus line. Application of the pull-down voltage is suspended if the external pull-up resistor is connected on the bus line. Thus, desirable communication behavior through the bus line can be achieved regardless of whether or not the external pull-up resistor is connected on the bus line.

According to another aspect of the present invention, there is provided a method of making bus connection from a semiconductor device to an external device through a bus line. The method includes a pull-down voltage applying step of applying a pull-down voltage through an internal pull-down resistor in the semiconductor device to the bus line. The method also includes an external pull-up determining step of determining if an external pull-up resistor external to the semiconductor device is connected on the bus line. The determination is made on the basis of a voltage level of the bus line upon application of the pull-down voltage to the bus line. The method also includes an internal pull-up setting step of stopping application of the pull-down voltage, and applying a pull-up voltage through an internal pull-up resistor in the semiconductor device to the bus line if it is determined in the external pull-up determining step that the external pull-up resistor is not connected on the bus line. The internal pull-up setting step stops application of the pull-down voltage if it is determined in the external pull-up determining step that the external pull-up resistor is connected on the bus line.

The pull-down voltage is applied through the internal pull-down resistor of the semiconductor device to the bus line. It is then determined whether an external pull-up resistor is connected on the bus line on the basis of the voltage level of the bus line. Application of the pull-down voltage is suspended and a pull-up voltage is applied through the internal pull-up resistor of the semiconductor device to the bus line if no external pull-up resistor is connected on the bus line. Application of the pull-down voltage is suspended if the external pull-up resistor is connected on the bus line. Thus, desirable communication behavior through the bus line is achieved regardless of whether or not the external pull-up resistor is connected on the bus line.

These and other objects, aspects and advantages of the present invention will become apparent to those skilled in the art from the following detailed description when read and understood in conjunction with the appended claims and drawings.

DETAILED DESCRIPTION OF THE INVENTION

Figure 5:
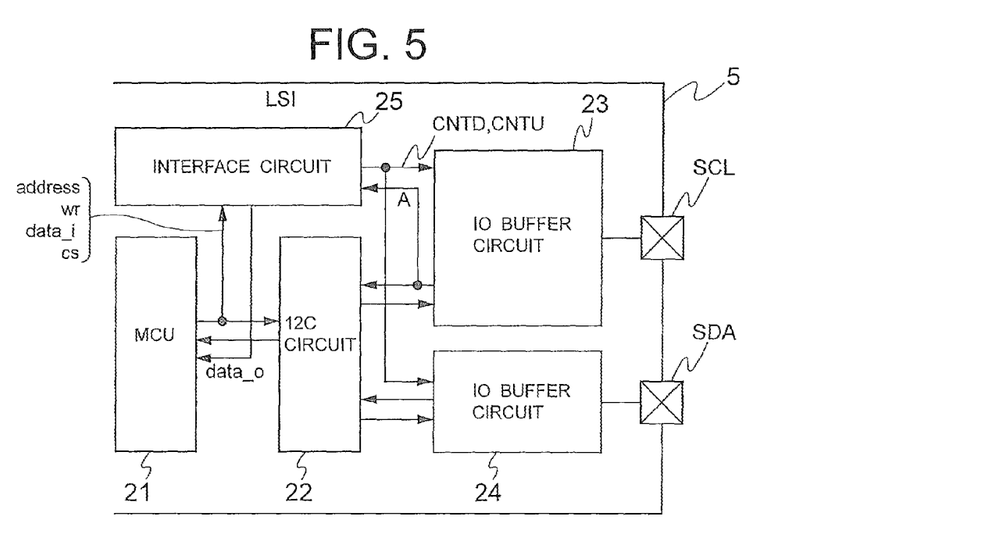
FIG. 5 illustrates a block diagram of an LSI with a bus connection circuit according to a first embodiment of the present invention.

Embodiments of the present invention will be described in detail below with reference to the accompanying drawings.
First Embodiment FIG. 5 shows the circuit configuration of an LSI 5 with a bus connection circuit according to a first embodiment of the present invention. The LSI 5 includes an MCU 21, an I2C circuit 22, two IO buffer circuits 23 and 24, and an interface circuit 25 that form in combination the bus connection circuit.

The MCU 21 and the I2C circuit 22 have similar structures to those of the MCU 11 and the I2C circuit 12 shown in FIG. 1, respectively. In FIG. 5, however, the MCU 21 is connected to the interface circuit 25 as well as to the I2C circuit 22. A clock signal is introduced to the IO buffer circuit 23.

Figure 6:
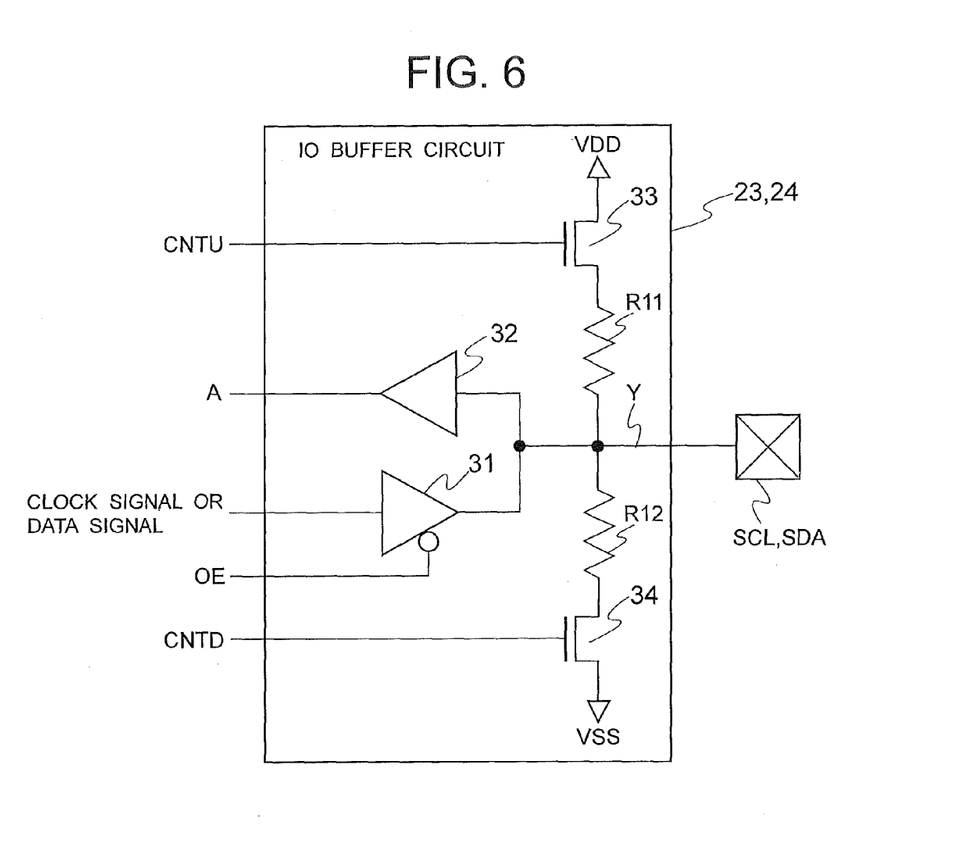
FIG. 6 is a circuit diagram of an IO buffer circuit in the LSI shown in FIG. 5.

Referring also to FIG. 6, the IO buffer circuit 23 includes an output buffer 31 with an enable terminal, an input buffer 32, field-effect transistors (FETs) 33 and 34, a resistor R11 (internal pull-up resistor), another resistor R12 (internal pull-down resistor), and a serial clock terminal SCL. The output and input buffers 31 and 32 have a similar connection structure to that of the output and input buffers 15 and 16 shown in FIG. 2, respectively. A series circuit of the drain and the source of the FET 33 (first switching element), and the pull-up resistor R11 is provided between a terminal to which a voltage VDD (pull-up voltage) is applied and a clock terminal SCL. A series circuit of the pull-down resistor R12, and the drain and the source of the FET 34 (second switching element) are provided between the clock terminal SCL and a terminal to which a ground potential VSS (pull-down voltage) is applied. A control signal CNTU is supplied from the interface circuit 25 to the gate of the FET 33. A control signal CNTD is supplied from the interface circuit 25 to the gate of the FET 34. For reduction of consumption current, resistance values of the resistors R11 and R12 are higher than those of the pull-up resistors R1 and R2 shown in FIG. 1, respectively.

The IO buffer circuit 24 receives a data signal. The buffer circuit 24 has the same structure as that of the IO buffer circuit 23, except that the IO buffer circuit 24 has a serial data terminal SDA instead of the serial clock terminal SCL.

Figure 7:
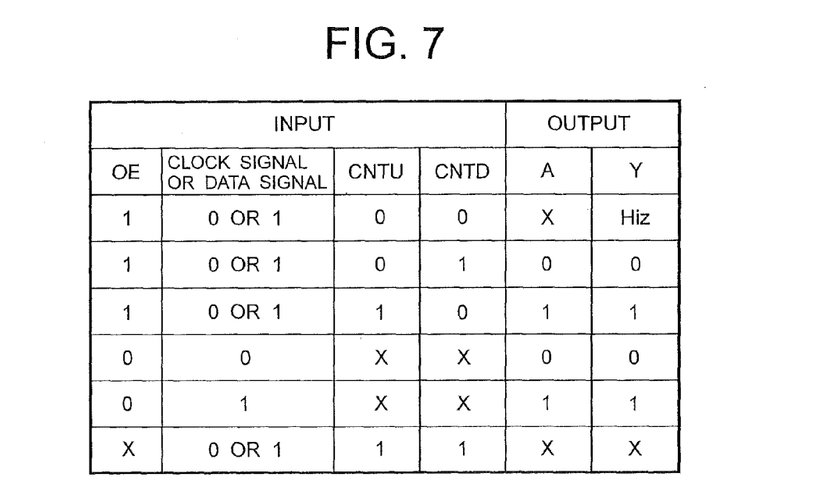
FIG. 7 shows a truth table relating to inputs and outputs of the buffer circuit shown in FIG. 6.

FIG. 7 shows a truth table relating to an input signal OE, a clock signal or a data signal, and signals CNTU, CNTD, A and Y of the IO buffer circuit 23, 24.

The interface circuit 25 is provided between the MCU 11 and the IO buffer circuit 23, 24, as shown in FIG. 5. The interface circuit 25 generates the signals CNTU and CNTD in response to the instructions from the MCU 21. The interface circuit 25 also transfers the signal A of the IO buffer circuit 23 to the MCU 11. The MCU 21 and the interface circuit 25 function as external pull-up determination unit and internal pull-up setting unit, respectively.

Figure 8:
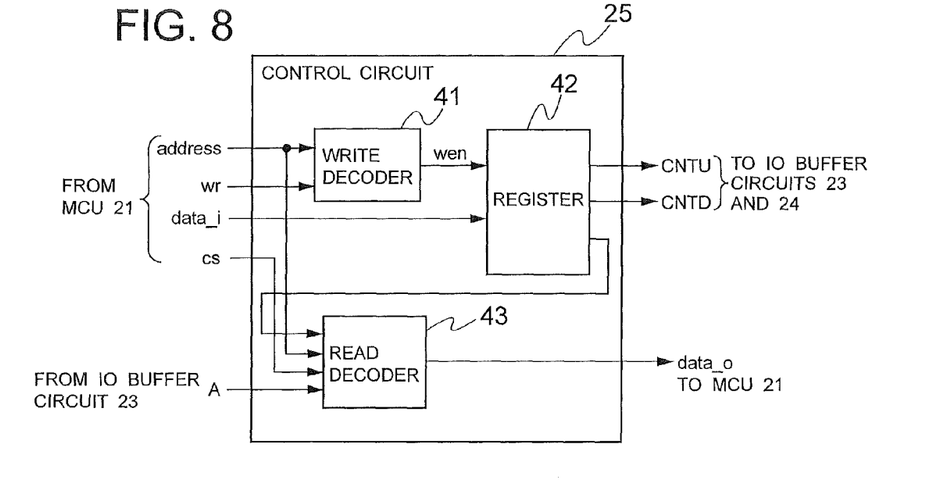
FIG. 8 is a block diagram showing the structure of a control circuit in the LSI shown in FIG. 5.

As shown in FIG. 8, the interface circuit 25 includes a write decoder 41, a register 42, and a read decoder 43. The write decoder 41 receives an address signal "address" and a write enable signal wr supplied from the MCU 21. The write decoder 41 is activated in response to the address signal "address" when the write enable signal wr represents, for example, a logic 1, and feeds a write signal "wen" to the register 42. The register 42 holds write data "data_i" from the MCU 21 upon receiving the write signal "wen," and supplies the write data "data_i" as the control signal CNTU or CNTD. The read decoder 43 receives the address signal "address" and a chip selector signal cs supplied from the MCU 21. The read decoder 43 also receives the contents of the register 42 and the signal A of the IO buffer circuit 23. The read decoder 43 comes into operation in response to the address signal "address" when the chip selector signal cs represents, for example, a logic 1 to selectively send the contents of the register 42 or the signal A as a data notifying signal "data o" to the MCU 21.

Figure 9:
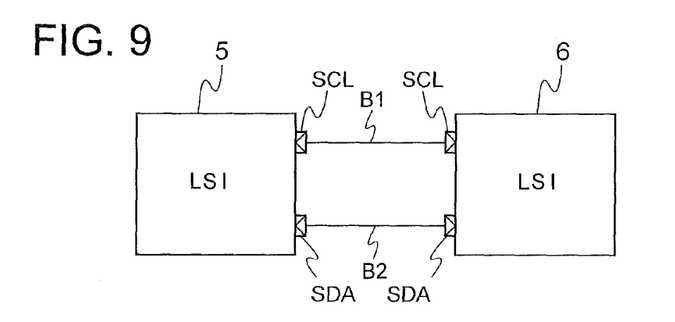
FIG. 9 shows bus connection without an external pull-up resistor between LSIs.
Figure 10:
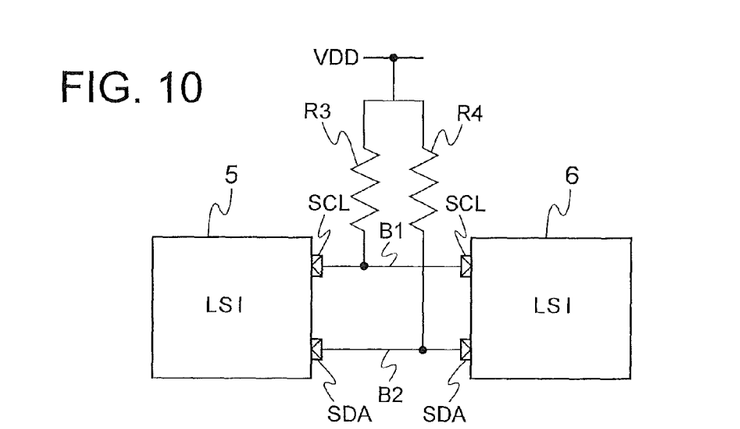
FIG. 10 shows bus connection with an external pull-up resistor being provided between LSIs.

The LSI 5 with the bus connection circuit of the above-described configuration can be connected through bus lines B1 and B2 to another LSI 6 as shown in FIG. 9 without an external pull-up resistor. Alternatively, the LSI 5 may be connected through the bus lines B1 and B2 to the separate LSI 6 if external pull-up resistors R3 and R4 are provided as shown in FIG. 10. The LSI 6 may be the same in configuration as the LSI 5. Alternatively, the LSI 6 may have a similar configuration to the LSI 1 (or 2) shown in FIG. 1.

The bus connection circuit is used when data to be written, for example, into an EPROM in the LSI 6 is transferred as a signal from the master LSI 5 to the slave LSI 6 in synchronization with a clock signal.

It should be noted that the number of slave LSIs 6 connected through the bus lines B1 and B2 to the LSI 5 in FIG. 9 or 10 is not limited to one, but a plurality of LSIs 6 may be connected.

Figure 11:
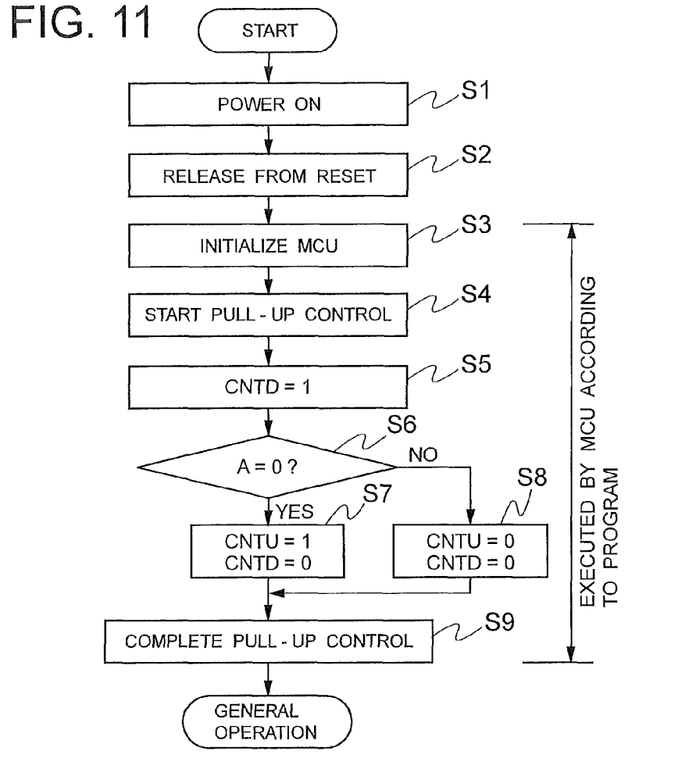
FIG. 11 is a flowchart for the operation of the LSI shown in FIG. 5 from power-on thereof to start of its general operation.

Referring now to FIG. 11, the operation of the LSI 5 will be described. The LSI 5 operates in a manner shown in FIG. 11 to set (decide, change) the logic value of the control signal CNTU in a period from power-on thereof to start of its general operation. First, in response to the power-on of the LSI 5 (step S1), each part of the LSI 5 is released from its reset state (step S2).

The MCU 21 is initialized so that the MCU 21 starts an operation according to a program (step S3). Then, the MCU 21 starts pull-up control (step S4).

After starting the pull-up control, the MCU 21 causes the interface circuit 25 to set the control signal CNTD at a logic 1 (step S5). The MCU 21 instructs the I2C circuit 22 to make the output enable signal OE a logic 1, and at the same time, sets each of the address signal "address," the write enable signal wr, and the write data "data_i" such that the signal CNTD becomes 1, thereby carrying out step S5 (corresponding to a first step performed by MCU in claim 4, and a pull-down voltage applying step in claim 15). The write decoder 41 is activated in response to the address signal "address" and the write enable signal wr, and stores the write data "data_i" into the register 42. The FET 34 in the IO buffer circuit 23 is turned on as the control signal CNTD becomes 1, thereby making the internal pull-down resistor R12 valid. At this time, the FET 33 is in an off state as the control signal CNTU represents a logic 0.

If no external pull-up resistor is connected on the bus line B1 as shown in FIG. 9, the signal Y of the clock terminal SCL is set at a logic 0 by the ground potential VSS applied through the turned-on FET 34 and the resistor R12. On the other hand, if the external pull-up resistor R3 is connected on the bus line B1 as shown in FIG. 10, the voltage VDD (pull-up voltage) is applied to the bus line B1 through the external pull-up resistor R3, thereby making the signal Y of the clock terminal SCL a logic 1. As seen from the truth table shown in FIG. 7, the output signal A of the output buffer 31 assumes the same logic value as that of the signal Y if the signals OE and CNTD are both 1.

Next, the MCU 21 determines whether the signal A of the IO buffer circuit 23 represents a logic 0 (step S6). In step S6 (corresponding to second and third steps performed by MCU in claim 4, and to an external pull-up determining step), the MCU 21 first sets the address signal "address" and the chip selector signal cs such that the signal A is supplied from the IO buffer circuit 23. Then, the read decoder 43 supplies the signal A of the IO buffer circuit 23 as the data notifying signal "data_o" to the MCU 21 in response to the address signal "address" and the chip selector signal cs from the MCU 21. This allows the MCU 21 to determine the logic value of the signal A of the IO buffer circuit 23 upon receiving the data notifying signal "data_o." Determining that the signal A is 0 means that there is no external pull-up resistor. In this case, the MCU 21 sets the control signals CNTU and CNTD at logics 1 and 0, respectively (step S7). On the other hand, determining that the signal A is 1 means that there is an external pull-up resistor. In this case, the MCU 21 sets both the control signals CNTU and CNTD at a logic 0 (step S8).

Step S7 (corresponding to a fourth step and an internal pull-up setting step) is performed if it is determined that there is no external pull-up resistor. In this step, the MCU 21 instructs the I2C circuit 22 to make the output enable signal OE a logic 0, and sets the address signal "address," the write enable signal wr and the write data "data_i" such that the signals CNTU and CNTD become 1 and 0, respectively. The write decoder 41 comes into operation in response to the address signal "address" and the write enable signal wr, and stores the write data "data_i" into the register 42, thereby completing step S7. Establishing that the control signal CNTU is 1 turns on the FET 33 in each of the IO buffer circuits 23 and 24. This makes the internal pull-up resistor R11 valid. Causing the control signal CNTD to be 0 turns off the FET 34 in each of the IO buffer circuits 23 and 24. This makes the internal pull-down resistor R12 invalid.

Step S8 (corresponding to a fifth step and the internal pull-up setting step) is performed if it is determined that there is an external pull-up resistor. In this step, the MCU 21 instructs the I2C circuit 22 to make the output enable signal OE a logic 0, and sets the address signal "address," the write enable signal wr, and the write data "data_i" such that both the signals CNTU and CNTD become O. The write decoder 41 comes into operation in response to the address signal "address" and the write enable signal wr to store the write data "data_i" into the register 42, thereby completing step S8. Establishing that the control signal CNTU is 0 causes the FET 33 in each of the IO buffer circuits 23 and 24 to remain off. This makes the internal pull-up resistor R11 invalid. Establishing that the control signal CNTD be 0 turns off the FET 34 in each of the IO buffer circuits 23 and 24. This makes the internal pull-down resistor R12 invalid.

The MCU 21 completes the pull-up control (step S9) after step S7 or S8, and then shifts to its general operation.

Figure 12:
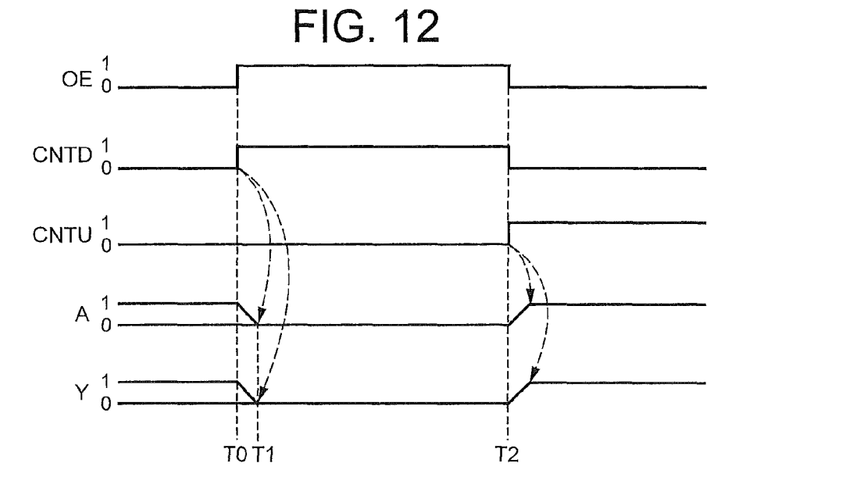
FIG. 12 shows a timing chart for various signals in a buffer circuit during pull-up control in the absence of an external pull-up resistor.

FIG. 12 shows how the signals OE, CNTD, CNTU, A and Y change during the pull-up control in the absence of an external pull-up resistor. In step S5 the output enable signal OE and the control signal CNTD are both set at a logic 1 at time T0. At time T1 immediately after the time T0, it is determined in step S6 that the signal A is at a logic 0. At time T2 after the time T1, the signals CNTD and CNTU are set to 0 and 1 in step S7, respectively. The internal pull-up resistor R11 is made valid at a time immediately after the time T2, so that both the signals A and Y represent a logic 1.

Figure 13:
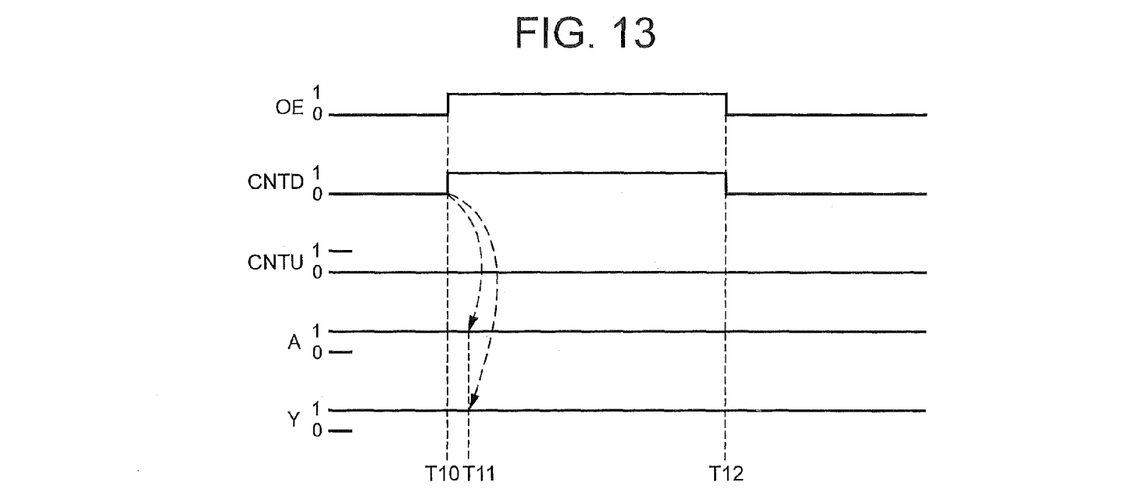
FIG. 13 shows a timing chart for various signals in the buffer circuit during the pull-up control in the presence of the external pull-up resistor.

FIG. 13 shows how the signals OE, CNTD, CNTU, A and Y change during the pull-up control in the presence of an external pull-up resistor. In step S5 the output enable signal OE and the control signal CNTD are both set at a logic 1 at time T10. At time T11 immediately after the time T10, it is determined in step S6 that the signal A is at a logic 1. At time T12 after the time T11, both the signals CNTD and CNTU are set to 0 in step S8. This means that the signals A and Y continue to represent a logic 1 as a result of the presence of the external pull-up resistor R3.

In the first embodiment, if no external pull-up resistor is connected on the bus line B1 or B2 between the two LSIs 5 and 6, the internal pull-up resistor R11 in each of the IO buffer circuits 23 and 24 is made valid and works on the bus line B1 or B2. If an external pull-up resistor is connected on the bus line B1 or B2 between the LSIs 5 and 6, the internal pull-up resistor R11 in each of the IO buffer circuits 23 and 24 is made invalid. In this case, the internal pull-up resistor R11 has no effect on the bus line B1 or B2, so that the external pull-up resistor is used. Thus, normal data (or signal) transfer on a bus is realized between the LSIs 5 and 6 regardless of whether or not an external pull-up resistor is connected on the bus line B1, B2. Connection of an external pull-up resistor on a bus line is not required, except for a case where the LSI 5, 6 of the first embodiment is connected to an existing bus line on which an external pull-up resistor is connected. This results in reduction of the number of parts external to the LSI 5, 6, and reduction of current consumption during use of the bus line. The MCU 21 provided in the LSI 5, 6 is used for pull-up control in the illustrated embodiment. Thus, the interface circuit 25 of a simple structure is only required as a hardware structure to be added to the LSI 5, 6.

Second Embodiment

Figure 14:
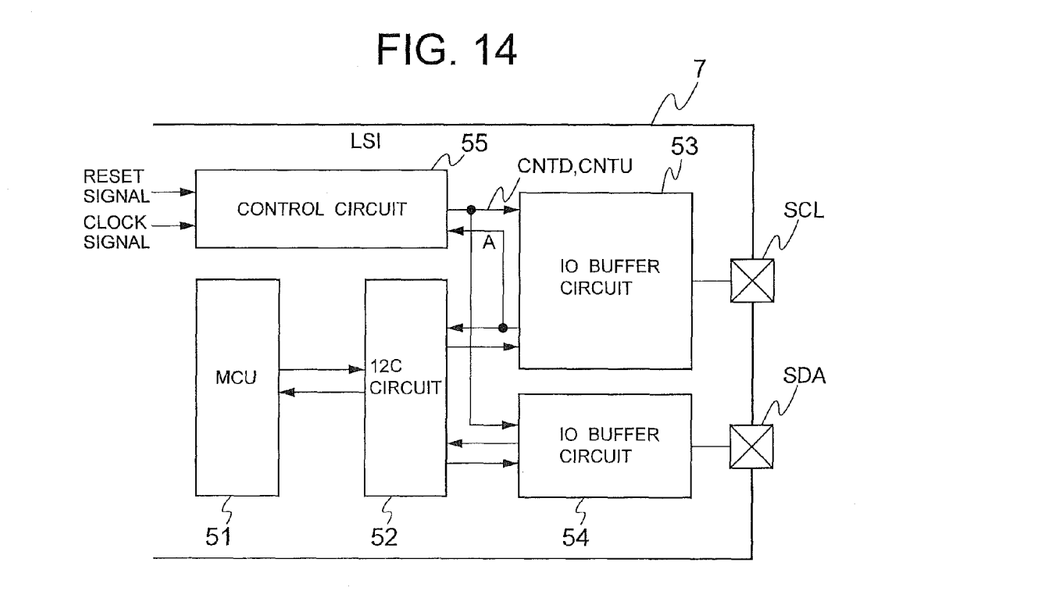
FIG. 14 illustrates a block diagram of an LSI with a bus connection circuit according to a second embodiment of the present invention.

FIG. 14 illustrates the circuit configuration of an LSI 7 with a bus connection circuit according to a second embodiment of the present invention. The LSI 7 includes an MCU 51, an I2C circuit 52, two IO buffer circuits 53 and 54, and a control circuit 55 that form in combination the bus connection circuit.

The MCU 51 and the I2C circuit 52 have similar structures to the MCU 11 and the I2C circuit 12 shown in FIG. 1, respectively. The IO buffer circuits 53 and 54 have similar structure to the IO buffer circuits 23 and 24 shown in FIG. 5. That is, the IO buffer circuits 53 and 54 have a structure such as that shown in FIG. 6.

The control circuit 55 is connected to the IO buffer circuits 53 and 54. Immediately after power-on of the LSI 7, the control circuit 55 generates the signals CNTU and CNTD in response to a reset signal and a clock signal, and supplies the generated signals to each of the IO buffer circuits 53 and 54.

Figure 15:
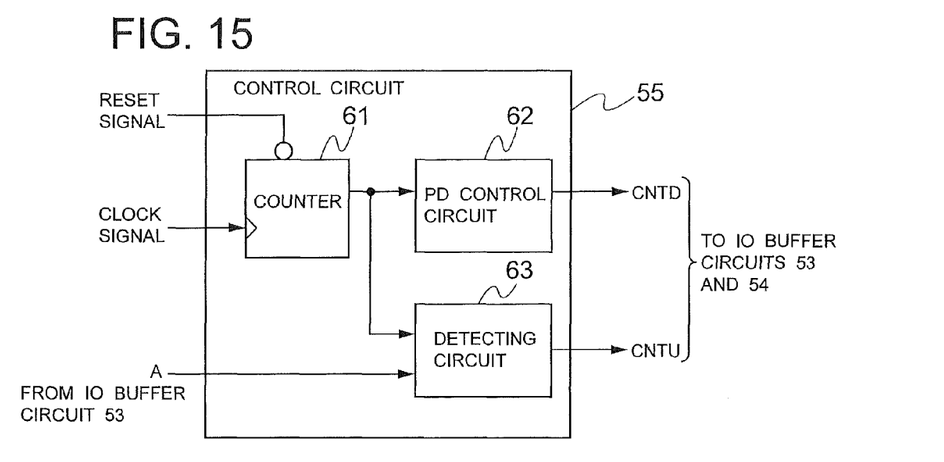
FIG. 15 is a block diagram showing the structure of a control circuit in the LSI shown in FIG. 14.

As shown in FIG. 15, the control circuit 55 includes a counter 61, a PD (pull-down) control circuit 62, and a detecting circuit 63. The counter 61 receives a reset signal from a reset signal generator (not shown), and a clock signal from a clock generator (not shown). The reset generator and the clock generator may be provided inside or outside the LSI 7. When the LSI 7 is released from its reset state in response to transition of the reset signal from a logic 0 to a logic 1, the counter 61 counts the pulses of the clock signal, and outputs a resultant count. The counting of the pulses continues until a resultant count reaches a predetermined value REF. In terms of a period of time for the pulse counting by the counter 61, the value REF corresponds to 10 μsec, for example. The resultant count at the counter 61 is supplied as a counting signal to the PD control circuit 62 and to the detecting circuit 63.

The PD control circuit 62 generates the control signal CNTD in response to the resultant count at the counter 61, and supplies the generated control signal CNTD to the IO buffer circuits 53 and 54. The PD control circuit 62 generates the control signal CNTD as a logic 1 in a period between when the reset signal becomes a logic 1 from a logic 0 and when the resultant count at the counter 61 reaches the value REF. The PD control circuit 62 otherwise outputs the control signal CNTD as a logic 0.

The detecting circuit 63 detects the logic value of the signal A of the IO buffer circuit 53 at a time when the resultant count at the counter 61 reaches the value REF. Then, the detecting circuit 63 sets (decides) the logic value of the control signal CNTU on the basis of a result of the detection. Specifically, the detecting circuit 63 outputs the control signal CNTU as a logic 1 if the detected logic value of the signal A is 1. The detecting circuit 63 outputs the control signal CNTU as a logic 0 if the detected logic value of the signal A is 0.

Figure 16:
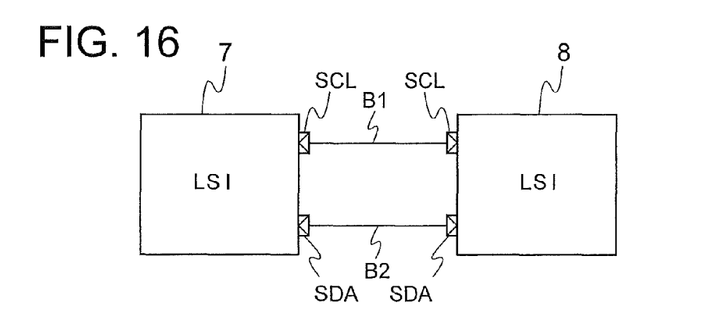
FIG. 16 shows bus connection with no external pull-up resistor provided between LSIs.
Figure 17:
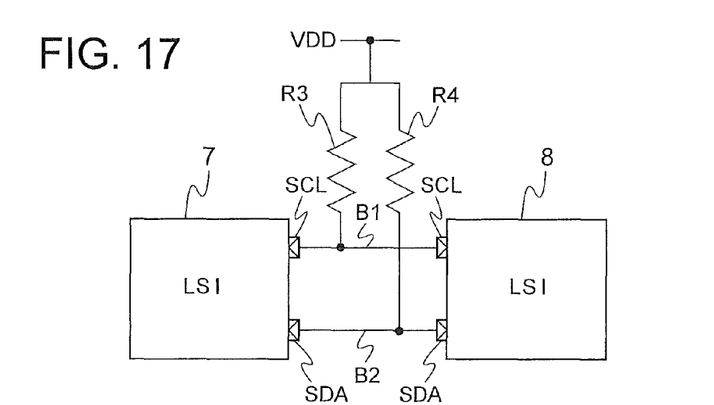
FIG. 17 shows bus connection with an external pull-up resistor provided between LSIs.

The LSI 7 with the bus connection circuit of the above-described configuration can be connected through bus lines B1 and B2 to another LSI 8 as depicted in FIG. 16 without an external pull-up resistor. Alternatively, the first LSI 7 may be connected through the bus lines B1 and B2 to the second LSI 8 in the presence of external pull-up resistors R3 and R4 as shown in FIG. 17. The LSI 8 may be the same in configuration as the LSI 5 (FIG. 9) or 7 (FIG. 14), or as the LSI 1 or 2 (FIG. 1).

Figure 18:
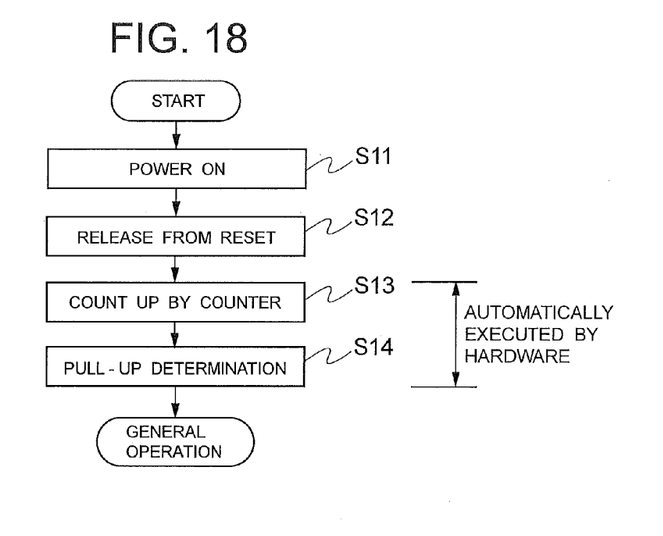
FIG. 18 is a flowchart for the operation of the LSI shown in FIG. 14 from power-on thereof to start of its general operation.

Referring now to FIG. 18, the operation of the LSI 7 will be described. The LSI 7 operates in a manner shown in FIG. 18 to set the logic value of the control signal CNTU in a period from power-on thereof to start of its general operation. First, upon turning on of the LSI 7 (step S11), the reset signal makes transition from a logic 0 to a logic 1 to release the LSI 7 from its reset state (step S12). The clock signal is then supplied to the counter 61. This triggers the counting of the pulse by the counter 61 (step S13). Next, the PD control circuit 62 and the detecting circuit 63 carry out a pull-up determining operation (step S14) on the basis of a resultant count at the counter 61.

Figure 19:
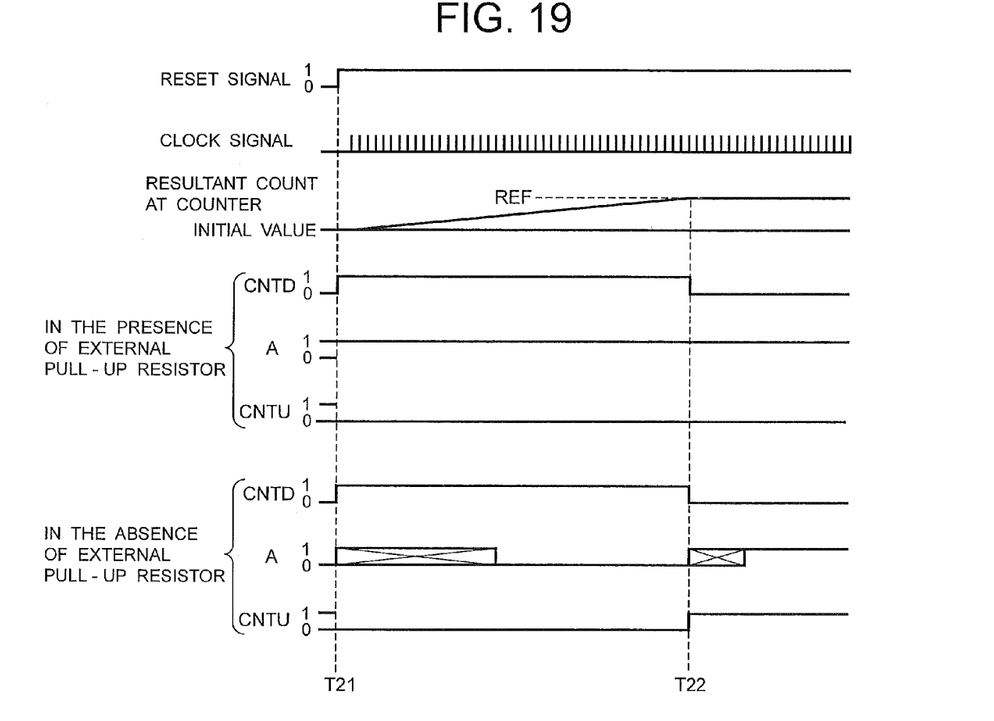
FIG. 19 shows a timing chart for signals in a buffer circuit during pull-up control in the presence of an external pull-up resistor and in the absence of an external pull-up resistor.

As shown in FIG. 19, in the pull-up determination operation the reset signal makes transition from a logic 0 to a logic 1 to release the LSI 7 from its reset state at time T21. Immediately after the time T21, the counter 61 starts counting the pulses of the clock signal. A resultant count at the counter 61 increments gradually, for example, from its initial value 0000. While the counter 61 counts the pulses, the PD control circuit 62 generates the control signal CNTD of a logic 1, and the detecting circuit 63 generates the control signal CNTU of a logic 0. The generated control signal CNTD of a logic 1 turns on the FET 33 in the IO buffer circuit 53. This turning on makes the internal pull-up resistor R11 valid. The generated control signal CNTU of a logic 0 turns off the FET 34 in the IO buffer circuit 53. This turning off makes the internal pull-down resistor R12 invalid.

When the resultant count at the counter 61 reaches the value REF at time T22, the detecting circuit 63 detects the logic of the signal A. As shown in FIG. 19, the detecting circuit 63 determines that the signal A is 1 if there is an external pull-up resistor. In this case, the detecting circuit 63 sets the control signal CNTU at a logic 0, and then outputs the resultant control signal CNTU. On the other hand, the detecting circuit 63 determines that the signal A is 0 if there is no external pull-up resistor. In this case, the detecting circuit 63 sets the control signal CNTU at a logic 1, and then outputs the resultant control signal CNTU. It should be noted that if the detecting circuit 63 determines that the signal A is 1 during the counting by the counter 61, the detecting circuit 63 may set the control signal CNTU at a logic 0, and then output the resultant control signal CNTU.

When the resultant count at the counter 61 reaches the value REF, the PD control circuit 62 makes the control signal CNTD a logic 0, and then outputs the resultant control signal CNTD.

In the presence of an external pull-up resistor, the signals CNTU and CNTD are both set to 0 in a period after the time T22. Because the control signal CNTU is 0, the FET 33 in each of the IO buffer circuits 53 and 54 remains in an off condition. This makes the internal pull-up resistor R11 invalid. Because the control signal CNTD is 0, the FET 34 in each of the IO buffer circuits 53 and 54 is turned off. This makes the internal pull-down resistor R12 invalid. This means that the external pull-up resistors R3 and R4 cause the signal A to represent a logic 1.

In the absence of an external pull-up resistor, the signals CNTU and CNTD are set to 1 and 0, respectively, in the period after the time T22. Because the control signal CNTU is 1, the FET 33 in each of the IO buffer circuits 53 and 54 is turned on. This makes the internal pull-up resistor R11 valid. Because the control signal CNTD is 0, the FET 34 in each of the IO buffer circuits 53 and 54 is turned off. This makes the internal pull-down resistor R12 invalid. This means that making the internal pull-up resistor R11 valid allows the signal A to represent a logic 1.

In the second embodiment, if no external pull-up resistor is connected on the bus line B1 or B2 between the two LSIs 7 and 8, the internal pull-up resistor R11 in each of the IO buffer circuits 53 and 54 is made valid and it works on the bus line B1 or B2. If an external pull-up resistor is connected on the bus line B1 or B2 between the LSIs 7 and 8, the internal pull-up resistor R11 in each of the IO buffer circuits 53 and 54 is made invalid. In this case, the internal pull-up resistor R11 does not work on the bus line B1 or B2, so that the external pull-up resistor is used. Thus, normal data or signal transfer on a bus is performed between the LSIs 7 and 8 regardless of whether or not an external pull-up resistor is connected on the bus line B1, B2. Connection of an external pull-up resistor on a bus line is not required, except for a case where the LSI 7 of the second embodiment is connected to an existing bus line on which an external pull-up resistor is already connected. This allows reduction of the number of parts external to the LSI 7, and reduction of consumed current while a bus line is used. Unlike the first embodiment, the control circuit 55 is provided as hardware to execute steps S13 and S14 after release from a reset state. Thus, control by the MCU 51 is unnecessary in the second embodiment. This allows reduction of a time required to complete pull-up control, and also allows compression of an internal program code. In the second embodiment, the control circuit 55 detects the length of time by using a clock signal. This allows the structure of the control circuit 55 to be relatively simple, and a chip size of the LSI can be reduced.

Although the two bus lines B1 and B2 are provided between the two LSIs in each of the above-described embodiments, the invention is not limited in this regard. LSIs may be connected to each other through a single bus line, or through three or more bus lines.

An LSI is taken as an exemplary semiconductor device in each of the illustrated embodiments, but the invention is not limited in this regard. A semiconductor device may be an IC (integrated circuit) device such as an SSI (small-scale integration) device and an MSI (medium-scale integration) device. An external device is not necessarily an IC such as an LSI, but it may be any device with a bus connection circuit.

This application is based on Japanese Patent Application No. 2010-143864 filed on Jun. 24, 2010, and the entire disclosure thereof is incorporated herein by reference.

What is claimed is:

1. A semiconductor device having a bus connection circuit adapted to make communication with an external device through a bus line, the bus connection circuit including:
   an internal pull-up resistor and an internal pull-down resistor;
   an external pull-up determination unit for applying a pull-down voltage through the internal pull-down resistor to the bus line, and determining whether an external pull-up resistor external to the semiconductor device is connected on the bus line, the determination being made based on a voltage level of the bus line upon application of the pull-down voltage to the bus line; and
   an internal pull-up setting unit for stopping application of the pull-down voltage, and applying a pull-up voltage through the internal pull-up resistor to the bus line if the external pull-up determination unit determines that no external pull-up resistor is connected on the bus line, and for stopping application of the pull-down voltage if the external pull-up determination unit determines that the external pull-up resistor is connected on the bus line.

2. The semiconductor device according to claim 1, wherein the external pull-up determination unit determines that no external pull-up resistor is connected on the bus line if the voltage level of the bus line is the same as the pull-down voltage, and the external pull-up determination unit determines that the external pull-up resistor is connected on the bus line if the voltage level of the bus line is the same as the pull-up voltage.

3. The semiconductor device according to claim 1, wherein the bus connection circuit further comprises:
   an internal pull-up circuit with a first series circuit of the internal pull-up resistor and a first switching element such that the pull-up voltage is supplied through the first series circuit to a connecting terminal of the bus line; and
   an internal pull-down circuit with a second series circuit of the internal pull-down resistor and a second switching element such that the pull-down voltage is supplied through the second series circuit to the connecting terminal of the bus line, and the external pull-up determination unit applies the pull-down voltage through the internal pull-down resistor to the bus line by turning on the second switching element, and the internal pull-up setting, unit stops application of the pull-down voltage by turning off the second switching element, and applies the pull-up voltage through the internal pull-up resistor to the bus line by turning on the first switching element.

4. The semiconductor device according to claim 3, wherein the external pull-up determination unit and the internal pull-up setting unit are built in an MCU (micro control unit) and an interface circuit, and the MCU sequentially executes:

causing the interface circuit to turn on the second switching element, causing the interface circuit to supply the voltage level of the connecting terminal to the MCU, determining if the external pull-up resistor is connected on the bus line based on the voltage level of the connecting terminal, causing the interface circuit to turn off the second switching element and to turn on the first switching element if the voltage level of the connecting terminal is the same as the pull-down voltage, and causing the interface circuit to turn off the second switching element if the voltage level of the connecting terminal is the same as the pull-up voltage.

5. The semiconductor device according to claim 3, wherein the external pull-up determination unit and the internal pull-up setting unit are built in a control circuit, and the control circuit includes:

a counter for counting pulses of a clock signal from an initial value;

a pull-down control circuit for keeping the second switching element in a turned-on condition until a resultant count at the counter reaches a predetermined value, and turning off the second switching element when the resultant count at the counter reaches the predetermined value; and a detecting circuit for turning on the first switching element if the resultant count at the counter reaches the predetermined value and the detecting circuit detects that the voltage level of the connecting terminal is the same as the pull-down voltage.

6. The semiconductor device according to claim 1, wherein the external pull-up determination unit and the internal pull-up setting unit come into operation immediately after power-on of the semiconductor device.

7. The semiconductor device according to claim 1, wherein the semiconductor device is an LSI (large scale integration) device, SSI (small scale integration) device or MSI (medium scale integration) device.

8. A bus connection circuit for use in a semiconductor device to make communication from the semiconductor device to an external device through a bus line, the bus connection circuit comprising:

an internal pull-up resistor;

an internal pull-down resistor;

an external pull-up determination unit for determining whether an external pull-up resistor external to the semiconductor device is connected on the bus line, the determination being made based on a voltage level of the bus line upon application of a pull-down voltage to the bus line through the internal pull-down resistor; and an internal pull-up setting unit for stopping application of the pull-down voltage, and applying a pull-up voltage through the internal pull-up resistor to the bus line if the external pull-up determination unit determines that no external pull-up resistor is connected on the bus line, and for stopping application of the pull-down voltage if the external pull-up determination unit determines that the external pull-up resistor is connected on the bus line.

9. The bus connection circuit according to claim 8, wherein the external pull-up determination unit determines that no external pull-up resistor is connected on the bus line if the voltage level of the bus line is the same as the pull-down voltage, and the external pull-up determination unit determines that the external pull-up resistor is connected on the bus line if the voltage level of the bus line is the same as the pull-up voltage.

10. The bus connection circuit according to claim 8, wherein the bus connection circuit further comprises:

an internal pull-up circuit with a first series circuit of the internal pull-up resistor and a first switching element such that the pull-up voltage is supplied through the first series circuit to a connecting terminal of the bus line; and an internal pull-down circuit with a second series circuit of the internal pull-down resistor and a second switching element such that the pull-down voltage is supplied through the second series circuit to the connecting terminal of the bus line, and the external pull-up determination unit applies the pull-down voltage through the internal pull-down resistor to the bus line by turning on the second switching element, and the internal pull-up setting unit stops application of the pull-down voltage by turning off the second switching element, and applies the pull-up voltage through the internal pull-up resistor to the bus line by turning on the first switching element.

11. The bus connection circuit according to claim 10, wherein the external pull-up determination unit and the internal pull-up setting unit are built in an MCU (micro control unit) and an interface circuit, and the MCU sequentially executes:

causing the interface circuit to turn on the second switching element, causing the interface circuit to supply the voltage level of the connecting terminal to the MCU, determining if the external pull-up resistor is connected on the bus line based on the voltage level of the connecting terminal, causing the interface circuit to turn off the second switching element and to turn on the first switching element if the voltage level of the connecting terminal is the same as the pull-down voltage, and causing the interface circuit to turn off the second switching element if the voltage level of the connecting terminal is the same as the pull-up voltage.

12. The bus connection circuit according to claim 10, wherein the external pull-up determination unit and the internal pull-up setting unit are built in a control circuit, and the control circuit includes:

a counter for counting pulses of a clock signal from an initial value;

a pull-down control circuit for keeping the second switching element in a turned-on condition until a resultant count at the counter reaches a predetermined value, and turning off the second switching element when the resultant count at the counter reaches the predetermined value; and a detecting circuit for turning on the first switching element if the resultant count at the counter reaches the predetermined value and the detecting circuit detects that the voltage level of the connecting terminal is the same as the pull-down voltage.

13. The bus connection circuit according to claim 8, wherein the external pull-up determination unit and the internal pull-up setting unit come into operation immediately after power-on of the semiconductor device.

14. The bus connection circuit according to claim 8, wherein the semiconductor device is an LSI (large scale integration) device, SSI (small scale integration) device or MSI (medium scale integration) device.

15. A method of establishing bus connection from a semiconductor device to an external device through a bus line, the method comprising:

applying a pull-down voltage through an internal pull-down resistor in the semiconductor device to the bus line;

determining whether an external pull-up resistor external to the semiconductor device is connected on the bus line, the determination being made based on a voltage level of the bus line upon application of the pull-down voltage to the bus line;

stopping application of the pull-down voltage, and applying a pull-up voltage through an internal pull-up resistor in the semiconductor device to the bus line if it is determined that the external pull-up resistor is not connected on the bus line; and suspending application of the pull-down voltage if it is determined that the external pull-up resistor is connected on the bus line.

16. The method of establishing bus connection according to claim 15, wherein said determining includes determining that the external pull-up resistor is not connected on the bus line if the voltage level of the bus line is the same as the pull-down voltage, and determining that the external pull-up resistor is connected on the bus line if the voltage level of the bus line is the same as the pull-up voltage.

17. The method of establishing bus connection according to claim 16 further comprising counting pulses of a clock signal from an initial value to provide a resultant count of the pulses, and wherein said applying a pull-down voltage includes applying the pull-down voltage until the resultant count of the pulses reaches a predetermined value, and said stopping application of the pull-down voltage, and applying a pull-up voltage through an internal pull-up resistor to the bus line is carried out when it is determined that the voltage level is equal to the pull-down voltage after the resultant count of the pulses reaches the predetermined value; and said suspending application of the pull-down voltage is carried out when the voltage level is equal to the pull-up voltage after the resultant count of the pulses reaches the predetermined value.

\* \* \* \* \*